US 6,987,279 B2

(12) United States Patent
Hoshino et al.

(10) Patent No.: US 6,987,279 B2
(45) Date of Patent: Jan. 17, 2006

(54) LIGHT SOURCE DEVICE AND EXPOSURE EQUIPMENT USING THE SAME

(75) Inventors: Hideo Hoshino, Hiratsuka (JP); Hiroshi Komori, Hiratsuka (JP); Akira Endo, Tokyo (JP)

(73) Assignees: Komatsu Ltd., Tokyo (JP); Gigaphoton Inc., Tokyo (JP)

( * ) Notice: Subject to any disclaimer, the term of this patent is extended or adjusted under 35 U.S.C. 154(b) by 0 days.

(21) Appl. No.: 11/014,961

(22) Filed: Dec. 20, 2004

(65) Prior Publication Data

US 2005/0167618 A1 Aug. 4, 2005

(30) Foreign Application Priority Data

Jan. 7, 2004 (JP) ............................. 2004-002142

(51) Int. Cl.
*G01J 1/00* (2006.01)
*H01J 17/26* (2006.01)
*H01J 35/00* (2006.01)
*B06B 6/00* (2006.01)

(52) U.S. Cl. ............................. 250/504 R; 250/423 R; 250/424; 250/425

(58) Field of Classification Search .................... None
See application file for complete search history.

(56) References Cited

U.S. PATENT DOCUMENTS

2004/0071267 A1 * 4/2004 Jacob et al. ................. 378/119
2004/0108473 A1 * 6/2004 Melnychuk et al. ..... 250/504 R
2004/0160155 A1 * 8/2004 Partlo et al. ............ 313/231.31
2005/0016679 A1 * 1/2005 Ruzic et al. .............. 156/345.5
2005/0155624 A1 * 7/2005 Lee et al. .................... 134/1.1
2005/0167618 A1 * 8/2005 Hoshino et al. ........ 250/504 R

FOREIGN PATENT DOCUMENTS

JP 2552433 8/1996
JP 3433151 5/2003

* cited by examiner

*Primary Examiner*—John R. Lee
*Assistant Examiner*—Bernard E. Souw
(74) *Attorney, Agent, or Firm*—Wenderoth, Lind & Ponack, L.L.P.

(57) ABSTRACT

A light source device capable of extending the life of a collector mirror and reducing running cost by protecting the collector mirror from debris that is considered harmful to a mirror coating while securing the collection solid angle and collection rate of EUV light. The light source device includes a target supply unit for supplying a material to become the target; a laser unit for generating plasma by applying a laser beam to the target; a collection optical system for collecting the extreme ultra violet light radiating from the plasma and emitting the extreme ultra violet light; and magnetic field generating unit for generating a magnetic field within the collection optical system when supplied with current so as to trap charged particles radiating from the plasma.

16 Claims, 14 Drawing Sheets

LIGHT SOURCE DEVICE AND EXPOSURE EQUIPMENT USING THE SAME

BACKGROUND OF THE INVENTION

1. Field of the Invention

The present invention relates to a light source device for generating extreme ultra violet (EUV) light by applying a laser beam to a target. Furthermore, the present invention relates to exposure equipment using such a light source device.

2. Description of a Related Art

With finer semiconductor processes, the photolithography makes rapid progress to finer fabrication, and, in the next generation, microfabrication of 100 to 70 nm, further, microfabrication of 50 nm or less will be required. For example, in order to fulfill the requirement for microfabrication of 50 nm or less, the development of exposure equipment with a combination of an EUV light source of about 13 nm in wavelength and a reduced projection catoptric system is expected.

As the EUV light source, there are three kinds of light sources, which include an LPP (laser produced plasma) light source using plasma generated by applying a laser beam to a target, a DPP (discharge produced plasma) light source using plasma generated by discharge, and an SR (synchrotron radiation) light source using orbital radiation. Among them, the LPP light source has advantages that extremely high intensity near black body radiation can be obtained because plasma density can be considerably made larger, light emission of only the necessary waveband can be performed by selecting the target material, and there is no structure such as electrodes surrounding the light source and an extremely large collection solid angle of $2\pi$ sterad can be ensured because it is a point source having substantially isotropic angle distribution. Therefore, the LPP light source is thought to be predominant as a light source for EUV lithography requiring power of several tens of watts.

In the LPP light source, in the case where a solid material is used as a target to which a laser beam is applied for generating plasma, the heat generated by the laser beam application is conducted to the periphery of the laser beam applied region when the laser beam applied region turns into a plasma state, and the solid material is melted on the periphery thereof. The melted solid material radiates in large quantity as debris of more than several micrometers in diameter, and that causes damage to the collector mirror (specifically, to the mirror coating) to reduce the reflectance thereof. On the other hand, in the case where a gas is used as the target, although an amount of debris is reduced, the conversion efficiency from the power supplied to the driving laser into the power of EUV light is reduced.

A conventional light source device is shown in FIG. 14. A material as a target is injected downwardly from a nozzle 101. Plasma 104 is generated by applying a laser beam formed by converging laser light generated from a driving laser 102 with a focusing lens 103. The EUV light radiating from the plasma 104 is collected by the collector mirror 105, passes through a debris shield 107 as luminous flux (e.g., parallel light) 106, and then, transmitted to an exposure device.

At that time, in order to suppress the damage provided to the collector mirror 105 by the debris radiating with the EUV light, the collector mirror 105 is required to be separated from the region in which the laser beam is applied to the target. Further, in order to maintain the collection rate of EUV light, as the distance between the laser beam applied region and the collector mirror 105 becomes longer, the size of the collector mirror 105 is required to be made larger.

As a related technology, Japanese Patent Application Publication JP-B-3433151 discloses a laser plasma X-ray source in which damage to an optical mirror due to generated debris is prevented and the collection efficiency of X-ray is improved. This laser plasma X-ray source includes a magnetic field applying device for applying a magnetic field in a direction perpendicular to an injection direction of a target. Assuming that the traveling direction of the debris before deflected by the magnetic field is the injection direction of the target, by locating the optical mirror in a direction in which ionic state debris deflected by the magnetic field does not fly, the damage to the optical mirror can be prevented.

However, the fact is that the debris radiating from plasma flies in almost all directions. Further, since the ions emitted from the plasma have energy of several kilo electron volts, the traveling velocity thereof reaches several tens of kilometers per second. Therefore, assuming that the traveling velocity of plasma is several hundreds of meters per second that is the same as the traveling velocity of the target before becoming plasma, it is not effective to try to change the traveling direction of debris by the magnetic field, and the debris flies in almost all directions and the damage to the optical mirror can not be prevented.

In this document, since the necessary magnetic flux density is on the order from $10^{-1}$T to $10^{0}$T at the highest, the purpose can be achieved by using a commercially available strong permanent magnet. However, in order to generate such magnetic flux density, the distance between the permanent magnet and the laser beam applied region is required to be made very short. When the distance between the permanent magnet and the laser beam applied region is made very short, there is a problem that the collection solid angle of the optical mirror is significantly limited.

On the other hand, Japanese Patent Application Publication JP-B-2552433 discloses a removing method and device capable of radically removing debris generated from a solid target in a relative simple manner. According to the document, electric charges are provided to neutral fine particles produced with X-rays from plasma on the surface of a target material, an electromagnetic field in which an electric field and a magnetic field are mutually perpendicular by a pair of mesh-form electrodes arranged along the pathway of X-ray and an electromagnet disposed between the pair of electrodes, the charged fine particles are passed through the electromagnetic field, and thus, the orbit of the charged fine particles can be bend and eliminated to the outside of the X-ray pathway. Thereby, an X-ray optical element provided on the X-ray pathway can be protected.

However, in the case where the method is applied to the conventional light source device as shown in FIG. 14, it is necessary to dispose the electromagnet and electrodes between the generated plasma 104 and collector mirror 105. Accordingly, the EUV light is shielded by the electromagnet and electrodes and the collection solid angle becomes very small because of the long distance between the laser beam applied region and the collector mirror 105. Therefore, there is a problem that the collection rate of EUV light is drastically reduced.

SUMMARY OF THE INVENTION

The present invention has been achieved in view of the above-described problems. A first object of the present invention is to provide a light source device capable of extending the life of a collector mirror and reducing running cost by protecting the collector mirror from debris, that is considered harmful to a mirror coating, while securing the collection solid angle and collection rate of EUV light. Further, a second object of the present invention is to provide exposure equipment capable of realizing fine photolithography by using such a light source device.

In order to achieve the above objects, a light source device according to the present invention is a light source device for generating extreme ultra violet light by applying a laser beam to a target, and the device includes: a target supply unit for supplying a material to become the target; a laser unit for generating plasma by applying a laser beam to the target; a collection optical system for collecting the extreme ultra violet light radiating from the plasma and emitting the extreme ultra violet light; and magnetic field generating means for generating a magnetic field within the collection optical system when supplied with current so as to trap charged particles radiating from the plasma.

Further, exposure equipment according to the present invention is exposure equipment for exposing an object to light by using extreme ultraviolet light generated by applying a laser beam to a target, and the equipment includes: a target supply unit for supplying a material to become the target; a laser unit for generating plasma by applying a laser beam to the target; a collection optical system for collecting the extreme ultra violet light emitted from the plasma and emitting the extreme ultra violet light; magnetic field generating means for generating a magnetic field within the collection optical system when supplied with current so as to trap charged particles radiating from the plasma; an illuminating optical system for collecting the extreme ultra violet light emitted from the collection optical system onto a mask by using plural mirrors; and a projection optical system for exposing the object to light by using the extreme ultra violet light reflected from the mask.

According to the present invention, since the magnetic field generating means that operates when supplied with current is provided, the collector mirror can be protected from debris that is considered harmful to a mirror coating by generating a strong magnetic field within collection optical system while securing the collection solid angle and collection rate of EUV light. As a result, a light source device capable of extending the life of a collector mirror and reducing running cost can be provided. Further, exposure equipment capable of realizing fine photolithography can be provided by employing such a light source device.

DESCRIPTION OF THE PREFERRED EMBODIMENTS

Figure 1:
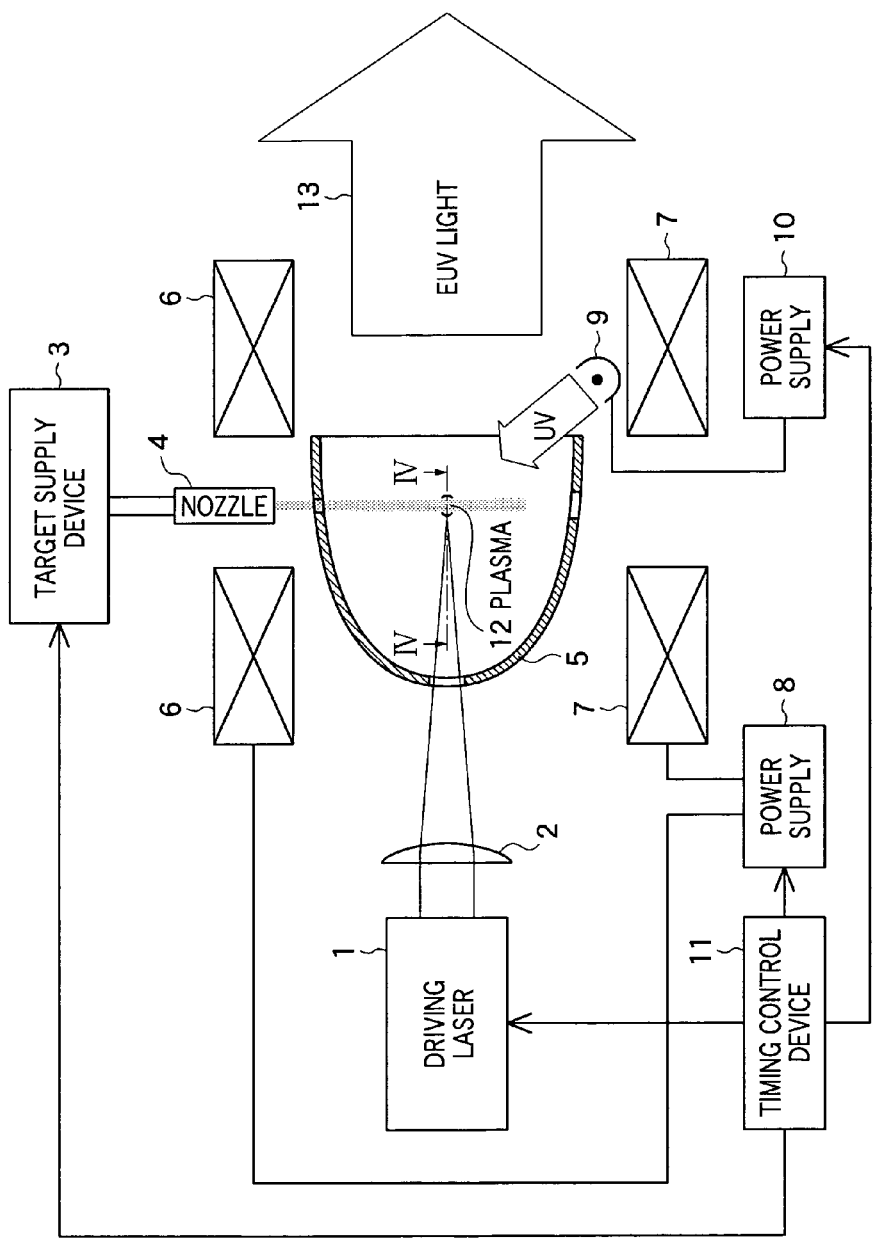
FIG. 1 shows the constitution of a light source device according to the first embodiment of the present invention.

Hereinafter, an embodiment of the present invention will be described in detail by referring to the drawings. The same reference numerals are assigned to the same component elements and the description thereof will be omitted.

In FIG. 1, the constitution of a light source device according to the first embodiment of the present invention is shown. This light source device includes a driving laser 1 as a laser unit for generating a laser beam and an application optical system for collecting the laser beam generated by the driving laser 1. In the embodiment, the application optical system is constituted by a focusing lens 2. As the focusing lens 2, a plano-convex lens, cylindrical lens, or a combination of those lenses can be used.

Further, the light source device includes a target supply device 3 as a target supply unit for supplying a material to become a target to which a laser beam is applied, and a nozzle 4 for injecting the material supplied from the target supply device 3, and further includes a collection optical system for collecting extreme ultra violet (EUV) light radiating from plasma and emitting the light. In the embodiment, the collection optical system is formed by a collector mirror 5. As the collector mirror 5, a parabolic mirror, a spherical mirror, a concave mirror having an ellipsoidal shape, or a spherical mirror having plural curvatures can be used. In the present invention, the EUV light has a wavelength from 5 nm to 50 nm. The laser unit applies a laser beam to the target supplied from the target supply unit, and thereby, plasma is generated. The collector mirror 5 collects the EUV light radiating from the plasma and emits the EUV light.

Figure 2:
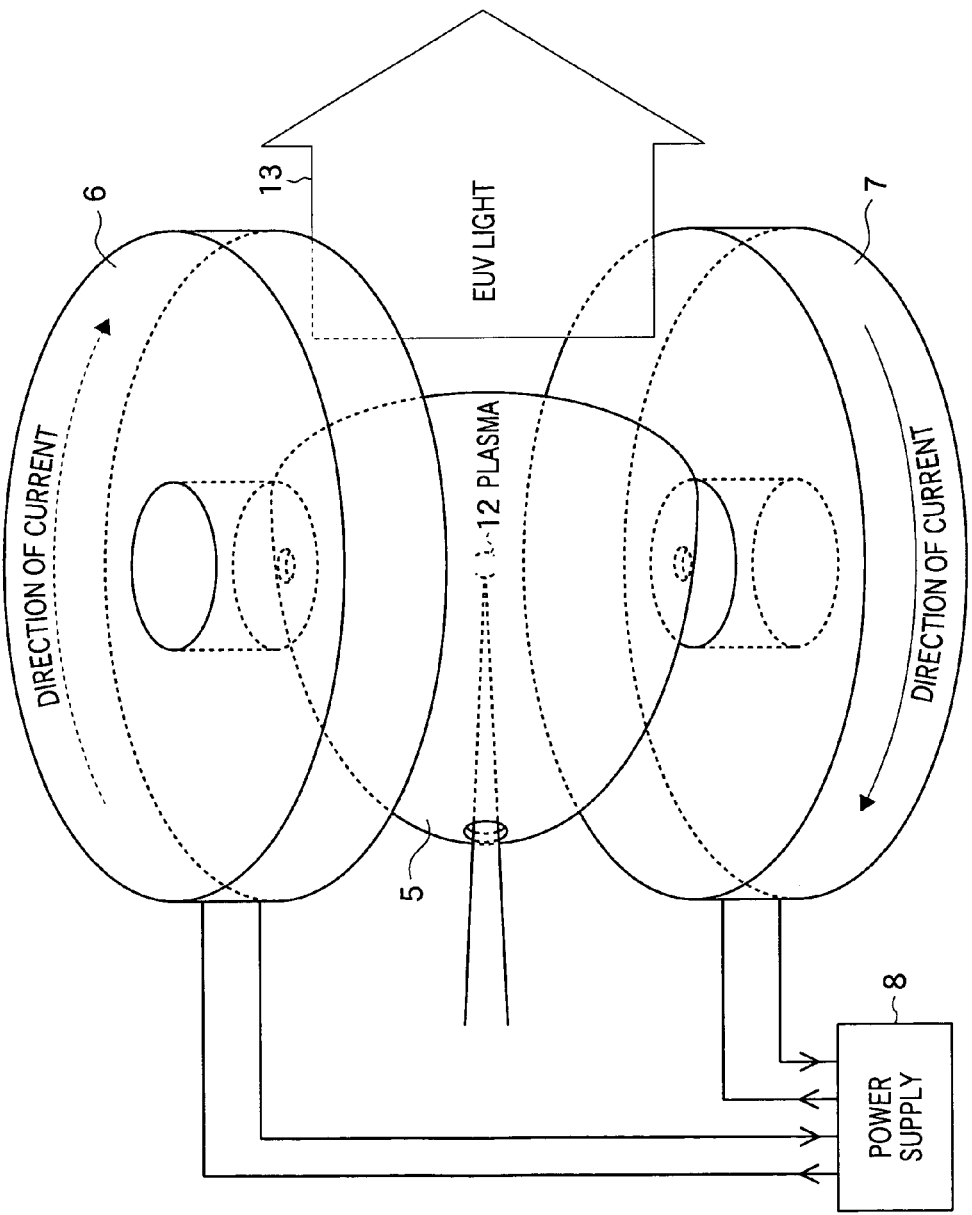
FIG. 2 is a perspective view showing a collector mirror and coils as shown in FIG. 1.

Further, the light source device includes coils 6 and 7 as magnetic field generating means for generating magnetic field when supplied with current, and a power supply 8 for supplying current to the coils 6 and 7. As shown in FIG. 2, each of the coils 6 and 7 has a cylindrical shape, and the two coils are disposed so that the central axes thereof may be aligned to form a pair of mirror coils. These two coils 6 and 7 are arranged to sandwich the collector mirror 5 in a direction perpendicular to the laser beam such that the central axes of the coils 6 and 7 passes a light emitting point. Here, the light emitting point means the position where plasma 12 is generated. By the way, the central axes of the coils 6 and 7 are not necessarily perpendicular to the laser beam as long as the collection light path of the EUV light is not blocked. Current is flowed in the coils 6 and 7 in a direction as shown by an arrow in FIG. 2.

In FIG. 1, the supply direction of the target supplied from the nozzle 4 is set substantially aligned with the central axes of the coils 6 and 7, however, the supply direction is not necessarily limited to the direction. For example, the target may be supplied in a direction nearly perpendicular to the target supply direction as shown in FIG. 1 and directed rearward from a sheet surface of the drawing.

The light source device as shown in FIG. 1 includes a timing control device 11 for controlling the driving laser 1, target supply device 3, power supply 8, etc. The timing control device 11 controls the timing with which the driving laser 1 generates a laser beam, the timing with which the target supply device 3 supplies a target, and the timing with which the power supply 8 flows current in the coils 6 and 7.

As the target, any one of gas, liquid, solid can be used. Specifically, a material in a gas state at normal temperature (20° C.) is applicable. For example, xenon (Xe), a mixture with xenon as the main component, argon (Ar), krypton (Kr), or water ($H_2O$) and alcohol, which are in a gas state in a low-pressure condition, can be used. Since the extreme ultra violet light generating unit is needed to be in a vacuum condition, even when water is supplied at normal temperature, it becomes gas after coming out from the nozzle.

Not only those materials, but also tin (Sn), lithium (Li), a compound with tin (Sn) as the main component or a compound with lithium (Li) as the main component can be used as the target.

In the case where the material to become a target is initially in a gas state, the gas may be supplied remaining in the gas state by emitting the gas with pressure from the opening of the nozzle 4. Alternatively, the gas may be supplied as a jet of aggregation of electrically charged atoms or molecules (cluster ions) produced by the cohesion of plural number of atoms or molecules with positive ions or negative ions as a core.

In this embodiment, liquid xenon (Xe) is used as the target. In this case, the generated EUV light has a wavelength from about 10 nm to about 15 nm. The target supply device 3 pressurizes and cools the liquid xenon, and thereby, the liquid xenon is injected from the opening of the nozzle 4 toward below, for example. The nozzle 4 has an opening in a single slit form or a circular form, or plural openings arranged in a line. Accordingly, the injected liquid xenon flows vertically according to the respective opening forms, and forms a column (continuous flow) of the liquid xenon or droplets.

In the case where the nozzle 4 has an opening in a single slit form or plural openings arranged in a line, the laser beam generated from the driving laser 1 is collected by the focusing lens 2, becomes a laser beam having a substantially linear sectional shape, passes through a hole formed in the collector mirror 5, and is applied toward the liquid xenon column or droplets. At a position where the laser beam is applied to the liquid xenon, the cigar-shaped plasma 12 having a length of several millimeters to several centimeters or a length of several tens of micrometers to several millimeters is generated.

On the other hand, in the case where the nozzle 4 has a single circular opening, the laser beam generated from the driving laser 1 is collected by the focusing lens 2, becomes a laser beam having a substantially circular sectional shape, passes through the hole formed in the collector mirror 5, and is applied toward the liquid xenon column or droplets. At a position where the laser beam is applied to the liquid xenon, the substantially spherical plasma 12 having a length of several tens to several hundreds of micrometers is generated.

The EUV light radiating from the plasma 12 is collected by the collector mirror 5 constituting the collection optical system, becomes a luminous flux (e.g., parallel light) 13, and is supplied to an exposure device. It is desired that the optical axis of the collection optical system is aligned with the longitudinal axis of the plasma 12 in the case where the plasma 12 has a cigar shape, and it is desired that the optical axis of the collection optical system passes substantially through the center of the plasma 12 in the case where the plasma 12 has a substantially spherical shape. As a material of mirror coating of inner surface (collector mirror surface) of the collector mirror 5, Mo/Si or Mo/Sr is used in the case where EUV light having a wavelength of 13 nm is generated, and Mo/Be or Mo/Sr is used in the case where EUV light having a wavelength of 11 nm is generated, and thereby, the collection efficiency can be improved. From the plasma 12, debris (neutral particle agglomerations and ions) causing damage to the collector mirror 5 (specifically, to the mirror coating) radiates with EUV light.

In the embodiment, by using a mirror magnetic field formed by the two coils 6 and 7, the light emitting point of EUV light is placed in the magnetic field and positively charged debris (ions) radiating from the plasma generated on the periphery of the light emitting point are trapped on the periphery of the light emitting point.

Figure 3:
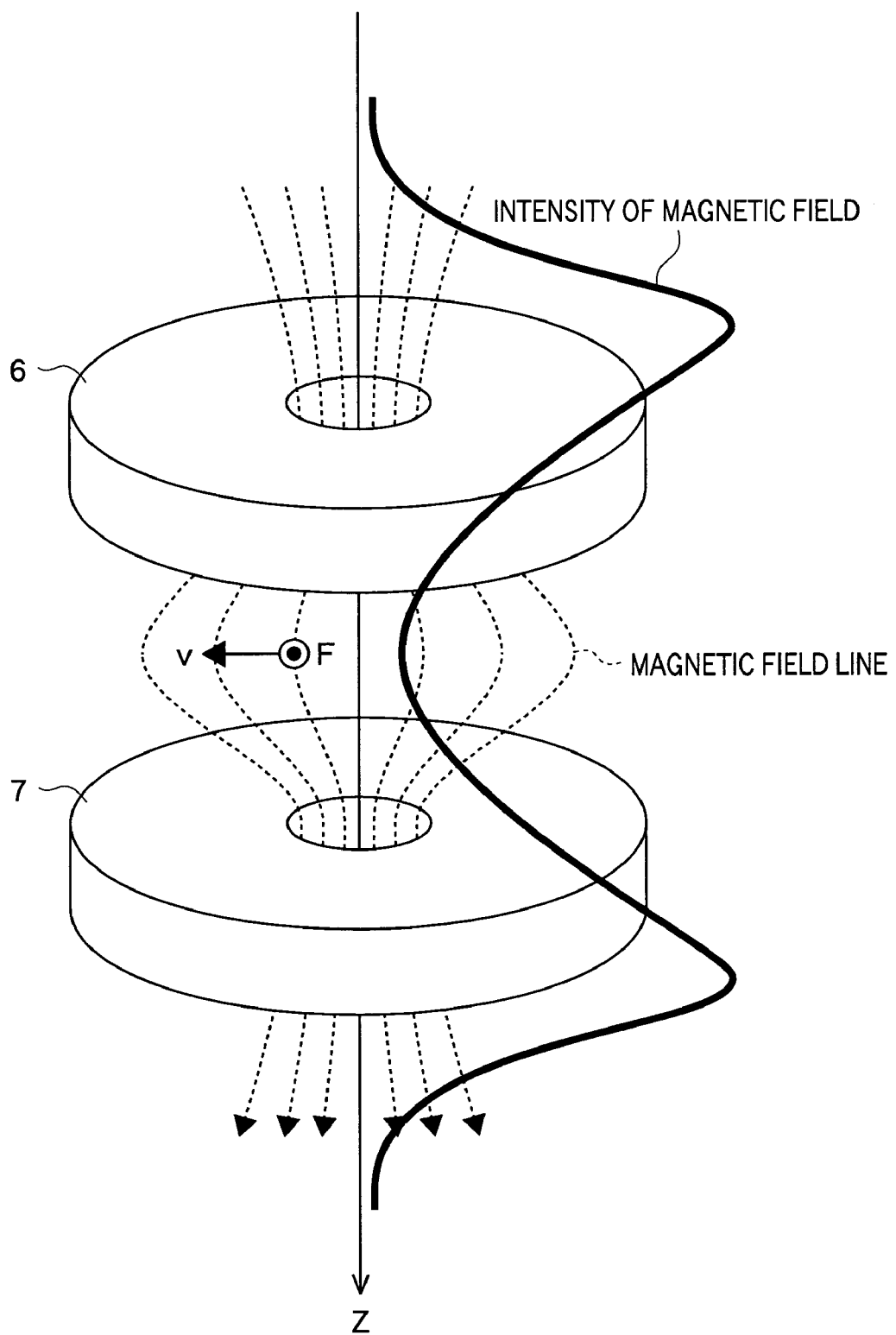
FIG. 3 is a diagram for explanation of a principle of trapping ions by using a mirror magnetic field.

FIG. 3 is a diagram for explanation of a principle of trapping ions by using the mirror magnetic field. As shown in FIG. 3, when the two coils 6 and 7 are disposed such that the central axes thereof may be aligned and current in the same direction is flowed in those coils 6 and 7, a magnetic field is formed in which the magnetic flux density is high near the coils 6 and 7 and the magnetic flux density is low intermediate between the coils 6 and 7. In FIG. 3, the axis of the coils 6 and 7 is set as the Z-axis, and the intensity of magnetic field along the Z-axis is shown by a solid line and the magnetic force lines are shown by broken lines.

Figure 4:
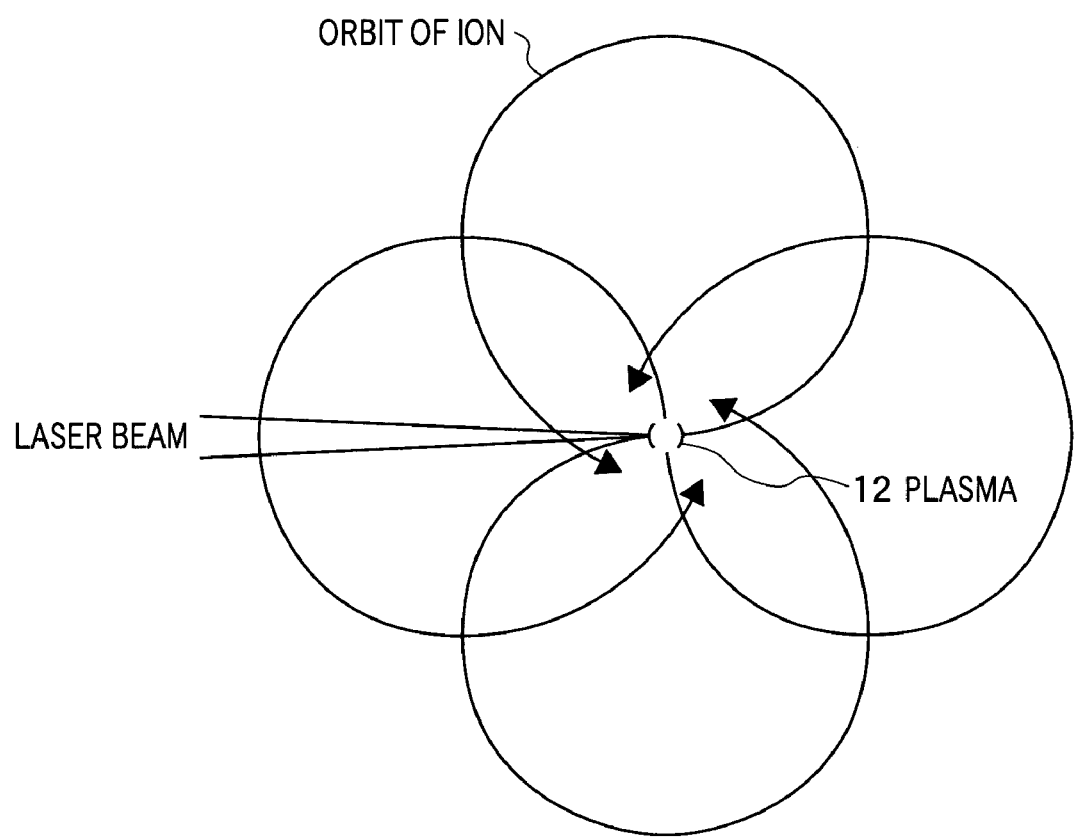
FIG. 4 is a sectional view along IV—IV in FIG. 1.

Since a positive ion generated near the Z-axis and having a velocity "v" in a direction perpendicular to the Z-axis is subject to a force "F" in a tangential direction of a circle around the Z-axis, the ion is trapped near the Z-axis. FIG. 4 is a sectional view along IV—IV in FIG. 1. In FIG. 4, a laser beam seen from the coil 6 side and orbits of ions moving within a plane perpendicular to the Z-axis are magnified and depicted. As shown in FIG. 4, the ions generated near the Z-axis and having velocities in a direction perpendicular to the Z-axis are subject to a force in a direction perpendicular to the velocities within the plane and rotated, and trapped near the Z-axis.

On the other hand, in FIG. 3, ions having velocities along the Z-axis are hardly subject to the action of the magnetic field. However, as shown in FIG. 1, the collector mirror 5 is provided with a hole surrounding the Z-axis for the target to pass through, and therefore, part of ions having velocities along the Z-axis pass through the hole for the target to pass through and comes out of the collector mirror 5. As a result, the parts of ions traveling in the z-axis direction do not collide with the collector mirror 5.

Further, an ion having a velocity component of Z-axis direction can be returned to the periphery of the light emitting point by generating a magnetic field so as to satisfy the following expression (1).

$$\sin \theta > (B_{MIN}/B_{MAX})^{1/2} \qquad (1)$$

Where $B_{MIN}$ is the lowest magnetic flux density intermediate between the coils 6 and 7, $B_{MAX}$ is the highest magnetic flux density in the vicinity between the coils 6 and 7, and θ is an angle formed by a velocity vector of an ion and the Z-axis in a position where the magnetic flux density is $B_{MIN}$. The magnetic flux densities $B_{MIN}$ and $B_{MAX}$ are determined according to shapes of coils 6 and 7, etc.

An ion that satisfies the expression (1) is trapped in a valley of potentials by the magnetic field generated by the coils 6 and 7, while an ion that does not satisfy the expression (1) cannot be trapped by the magnetic field. However, the shapes of the coils 6 and 7 and the diameter of the hole of the collector mirror 5 can be designed such that the ion that does not satisfy the expression (1) may be discharged to the outside through the hole of the collector mirror 5.

Figure 5:
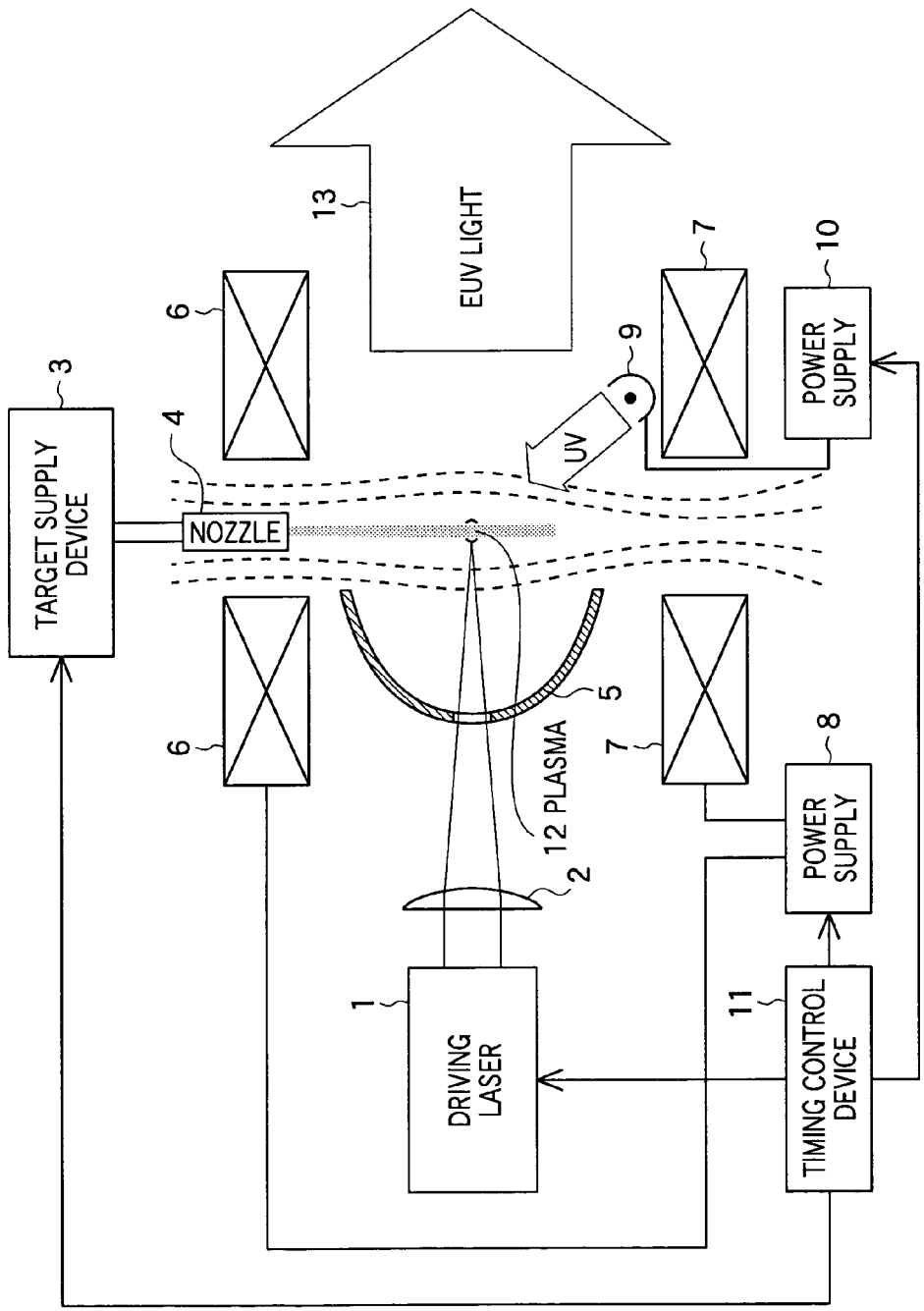
FIG. 5 shows a constitutional example of the light source device in the case where a collection solid angle of the collector mirror is small.

Further, in the case where the collection solid angle of the collector mirror 5 is less than 2π, the target supplied from the nozzle 4 can be supplied without providing a hole in the collector mirror 5 as shown in FIG. 5. In this case, by generating a magnetic field such that $B_{MIN}/B_{MAX}$ takes a numeric value close to "1" in the expression (1), most of the ions can be discharged in the Z-axis direction. In this case, there is an advantage that the concentration of the residual target gas near the plasma can be reduced. Thereby, the absorption of the generated EUV light by the target gas can be suppressed. By adjusting the size of the hole of the collector mirror 5, even in the collector mirror 5 having a collection solid angle of 2π or more, the same effect can be obtained.

Figure 6A:
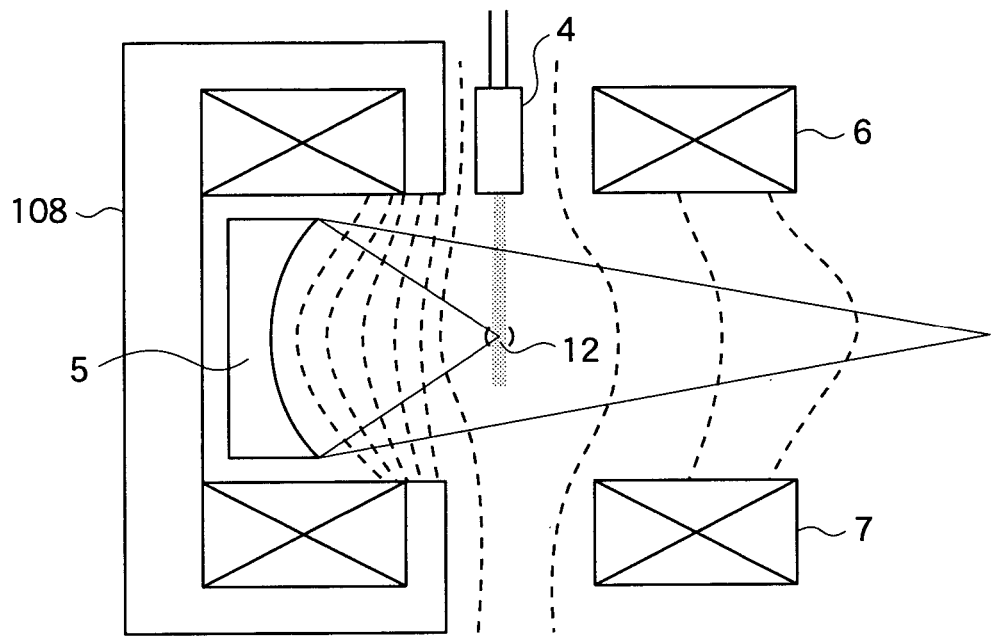
FIG. 6A shows an arrangement of the coils and an iron core in the case where a magnetic field with a biased intensity distribution is formed.
Figure 7:
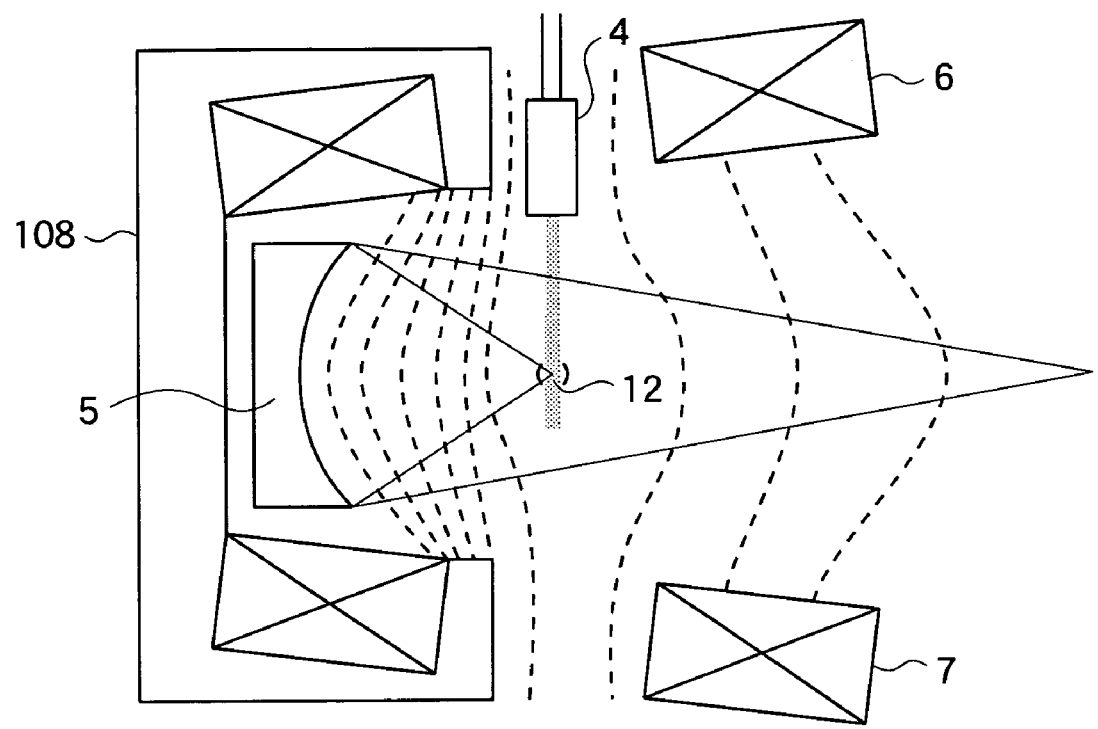
FIG. 7 shows another arrangement of the coils and an iron core in the case where a magnetic field with a biased intensity distribution is formed.

Further, in order to reduce ions incident to the collector mirror 5 and reduce the concentration of the residual target gas near the plasma, in the arrangement using a Helmholtz coil pair, a magnetic field may be generated so that the magnetic flux density at the opposite side to the collector mirror 5 becomes low as shown in FIG. 6A or FIG. 7. In this case, the ions flying out from the plasma toward the collector mirror 5 direction are deflected by the magnetic field and discharged in a direction in which the magnetic flux density is lower, that is, in a direction opposite to the collector mirror 5. Thereby, the absorption of the generated EUV light by the target gas can be suppressed.

Figure 6B:
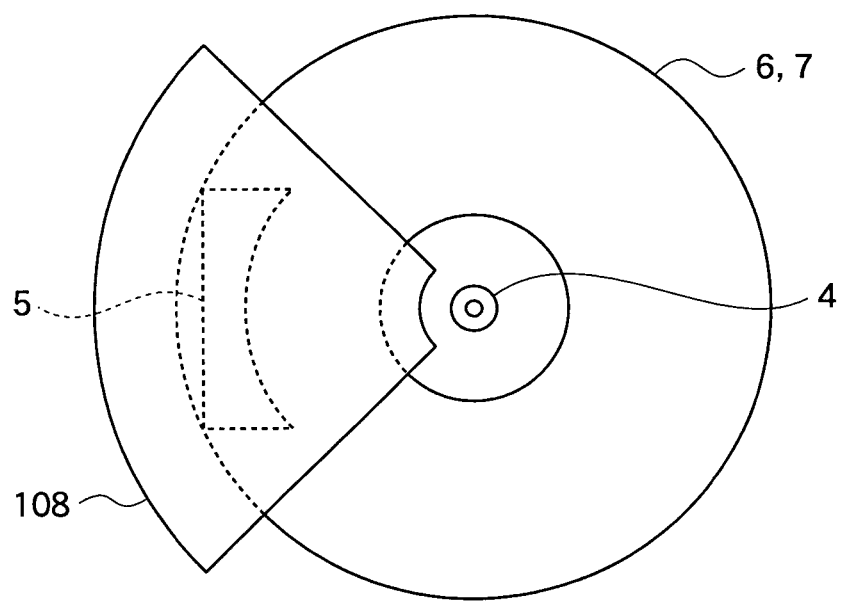
FIG. 6B is a view of the arrangement of FIG. 6A seen from above.

In order to form a magnetic field with a biased intensity distribution, for example, in FIG. 6A, the range in which the collector mirror 5 is located between the coils 6 and 7 is covered by an iron core 108. FIG. 6B is a view of FIG. 6A seen from above. As shown in FIG. 6B, the collector mirror 5 is included in the range covered by the iron core 108. Further, FIG. 7 shows another embodiment for forming a magnetic field with a biased intensity distribution. In FIG. 7, the coils 6 and 7 are not parallel with each other, and arranged such that the coil spacing is narrow at the collector mirror 5 side and coil spacing is wide at the opposite side thereto. Further, in FIG. 7, although the iron core 108 is not essential, the bias of the magnetic field distribution becomes larger by arranging the iron core 108 in the same range as shown in FIGS. 6A and 6B.

In the embodiment, the timing control device 11 controls the target supply device 3 to repeat the supply of the target at predetermined intervals, and controls the driving laser 1 to generate laser beams in the periods in which the target is supplied. Further, the timing control device 11 controls the power supply 8 to generate a pulse magnetic field by the coils 6 and 7 in a period after the driving laser 1 starts generating laser beams until it stops generating laser beams and ions lose kinetic energy to the level at which the ions no longer damage the collector mirror 5. Alternatively, without performing such timing control, the power supply 8 may supply current to the coils 6 and 7 in a steady state such that a steady magnetic field is generated by the coils 6 and 7.

According to the embodiment, since damage to the collector mirror can be prevented by trapping the debris on the periphery of the light emitting point of EUV light, the life of the collector mirror can be extended and the running cost can be reduced. Further, since the distance between the collector mirror and the light emitting point can be shortened while preventing the damage to the collector mirror by the debris, the collector mirror can be downsized while securing the collection solid angle and collection rate. Therefore, the production cost of the collector mirror can be reduced drastically. Furthermore, the collector mirror can be located at the driving laser side where many EUV lights are generated, and EUV light can be collected with high efficiency. Therefore, less input energy can reduce the running cost.

Further, since electrons emitted from the plasma can be trapped on the periphery of the light emitting point in the same manner as the positive ions, the diffusion velocity of positive ions, which are apt to be diffused by coulomb forces among the positive ions, can be reduced by coulomb forces between positive ions and electrons. Therefore, by trapping electrons on the periphery of the light emitting point, Larmor radius of positive ions can be made smaller and the positive ions can be trapped easily on the periphery of the light emitting point.

In the embodiment, trapping of positively charged debris (ions) on the periphery of the light emitting point has been described. However, as shown in FIG. 1, by providing an ultraviolet lamp 9 for generating ultraviolet (UV) light and a power supply 10 for supplying power to the ultraviolet lamp 9, the debris as neutral particles can be positively charged by applying ultraviolet light thereto. The energy of ultraviolet light is about 10 eV, and the material applied with ultraviolet light is positively ionized by emitting electrons and/or positively charged.

The power supply 10 may constantly supply power to the ultraviolet lamp 9, or may supply power to the ultraviolet lamp 9 in a period after the driving laser 1 starts generating laser beams until it stops generating laser beams and ions lose kinetic energy to the level at which the ions no longer damage the collector mirror 5 under the control of the timing control device 11. Further, in the case where many of the generated debris are neutral particles, the neutral particles can be negatively charged by providing electrons with reductive reaction by using an electron shower. If it is possible to negatively charge the neutral particles, the force by the magnetic field can be acted thereon. In the case of negatively charged particles, although they are subject to a force opposite to that to positive ions, they can be trapped on the periphery of the light emitting point similarly to the positive ions. Therefore, the particles can be prevented from colliding with the collector mirror.

Further, by applying an electron beam in place of the electron shower, the generated debris may be provided with charges. In the case of applying an electron beam, neutral particles can be positively ionized by ionization by collision. In this case, similarly, since the positive ions can be trapped on the periphery of the light emitting point by acting the force by the magnetic field, the particles can be prevented from colliding with the collector mirror.

Next, a light source device according to the second embodiment of the present invention will be described by referring to FIG. 8.

Figure 8:
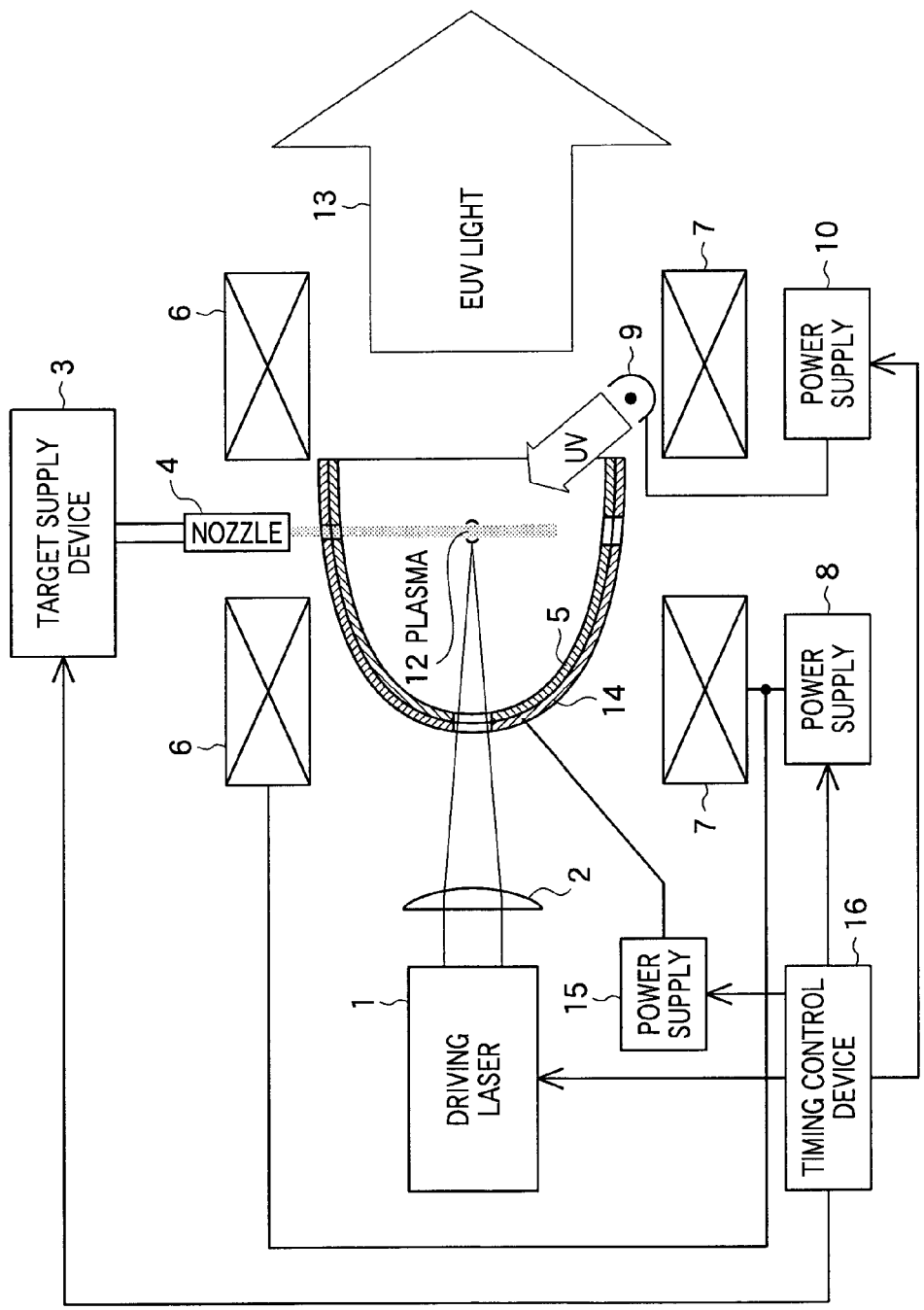
FIG. 8 shows the constitution of a light source device according to the second embodiment of the present invention.

In FIG. 8, the constitution of the light source device according to the second embodiment of the present invention is shown. The light source device shown in FIG. 8 includes an electrode 14 provided on the rear surface of the collector mirror 5, a power supply 15 for applying a pulsing high potential to the electrode 14, and a timing control device 16 for controlling the driving laser 1, target supply device 3, power supplies 8 and 15, etc. Other constitution is the same as the light source device as shown in FIG. 1.

The timing control device 16 controls the timing with which the driving laser 1 generates a laser beam, the timing with which the target supply device 3 supplies a target, the timing with which the power supply 8 flows current in the coils 6 and 7, and the timing with which the power supply 15 applies a pulsing high potential to the electrode 14, etc.

The power supply 15 applies a positive high potential to the electrode 14 in a period after the driving laser 1 starts generating laser beams until it stops generating laser beams and ions lose kinetic energy to the level at which the ions no longer damage the collector mirror 5 under the control of the timing control device 16, and thus, generates a strong pulse electric field on the periphery of the collector mirror 5.

Thereby, positive ions that are not trapped on the periphery of the light emitting point because they have been emitted from the plasma 12 at a high initial velocity or positive ions, that are not trapped on the periphery of the light emitting point because their quantities of electric charge are small in comparison with their masses, are returned before the collector mirror 5. Therefore, the damage to the collector mirror 5 can be prevented without making the intensity of magnetic field generated by the two coils 6 and 7 higher. Further, with respect to debris as neutral particles, the neutral particles can be positively charged by applying ultraviolet light to the neutral particles by using the ultraviolet lamp 9 supplied with power from the power supply 10. If it is possible to negatively charge the neutral particles, the force by the magnetic field can be acted thereon, and the particles can be prevented from colliding with the collector mirror.

Next, a light source device according to the third embodiment of the present invention will be described by referring to FIG. 9.

Figure 9:
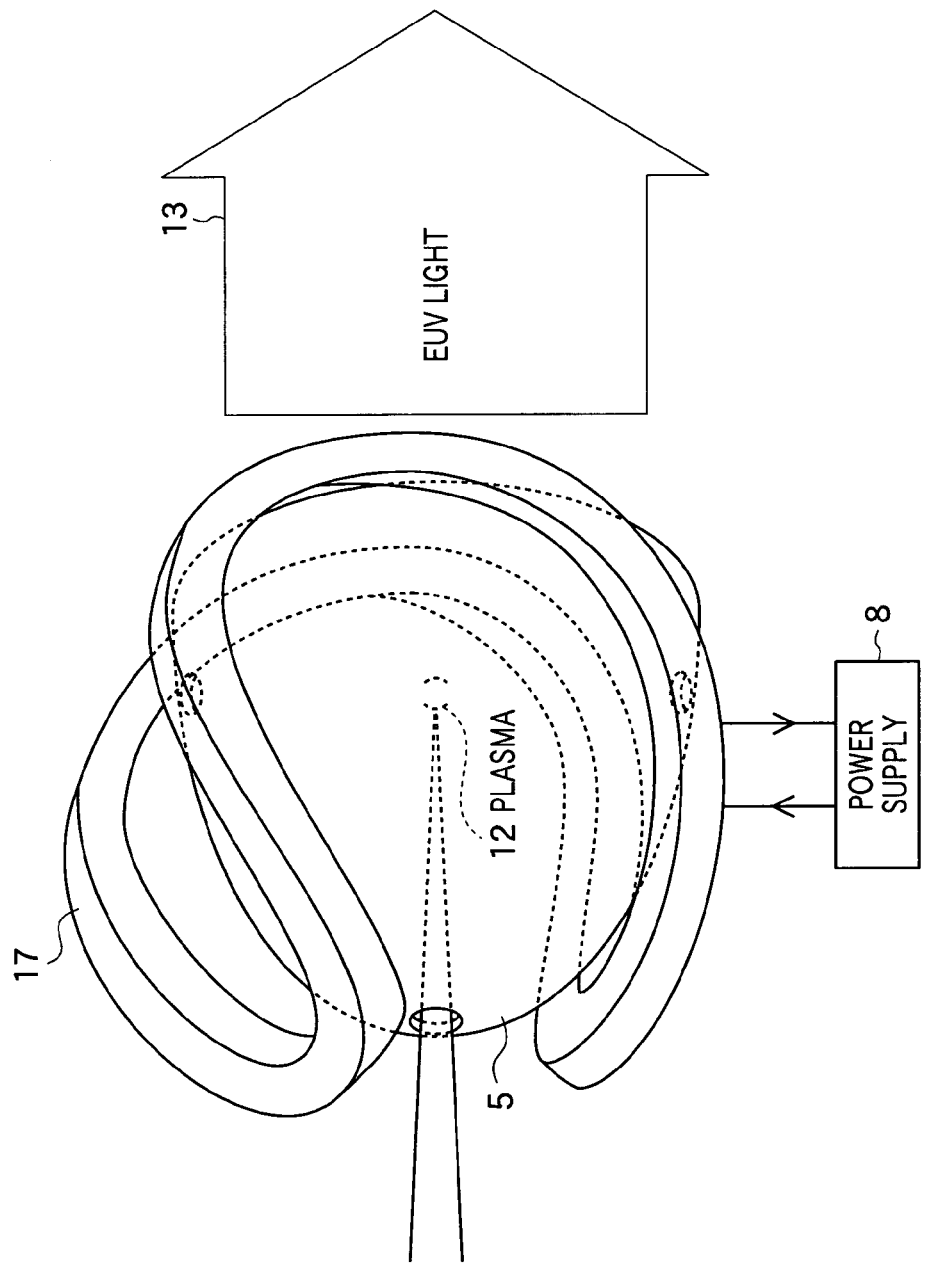
FIG. 9 is a perspective view showing a collector mirror and a coil of a light source device according to the third embodiment of the present invention.

FIG. 9 is a perspective view showing a collector mirror and a coil of the light source device according to the third embodiment of the present invention. Since the component elements other then the coil are the same as in the light source device as shown in FIG. 1, they are omitted in FIG. 9.

As shown in FIG. 9, the coil 17 in the embodiment has a shape along a curve like a seam line of a ball for baseball, and is generally called as a "baseball coil". Since the coil 17 is placed so as to wrap around the collector mirror 5, the light emitting point of EUV light is located within the magnetic field. In the embodiment, the coil 17 is placed such that the light emitting point of EUV light may be at the center of the ball shape, and positively charged debris (ions) emitted from the plasma generated at the light emitting point is trapped on the periphery of the light emitting point by using a baseball magnetic field generated by the baseball coil.

Figure 10:
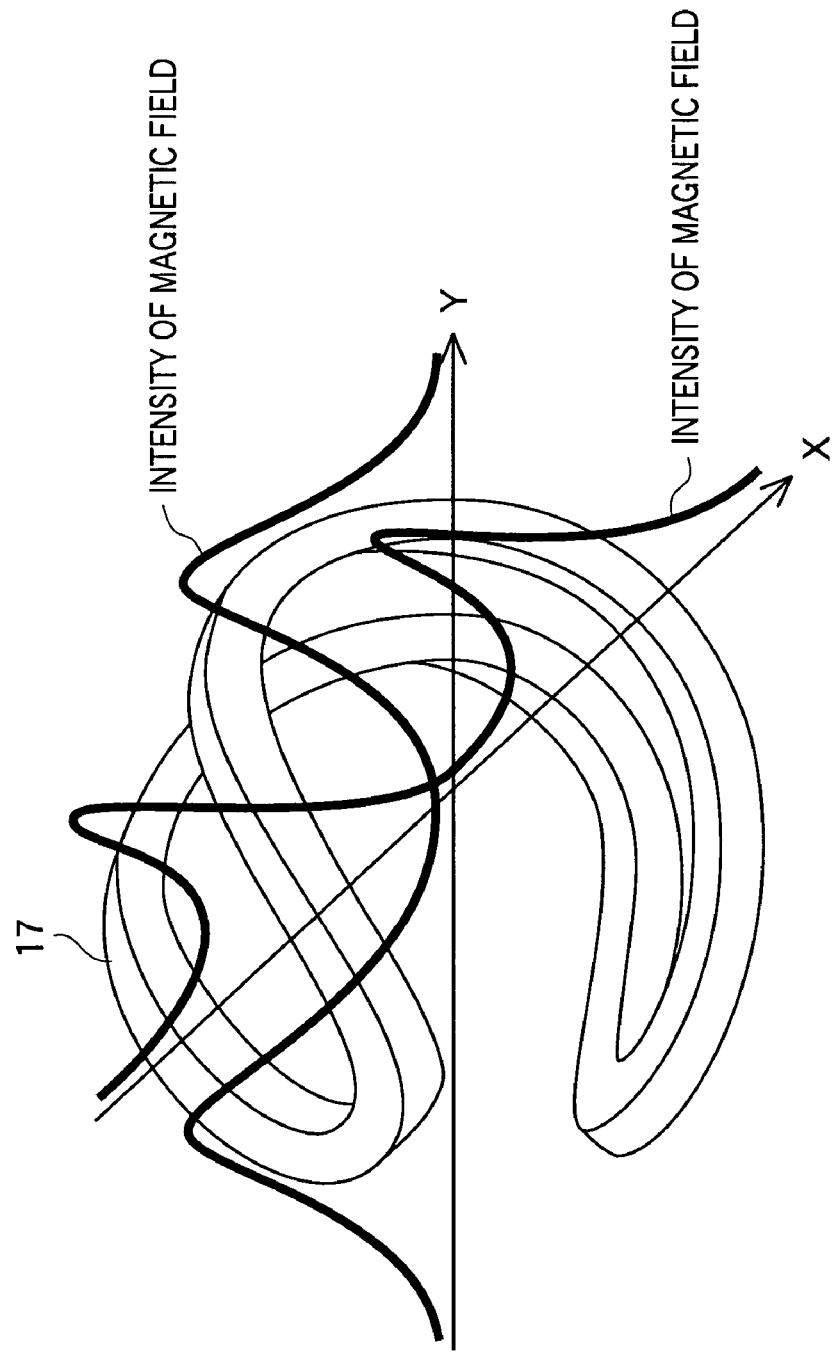
FIG. 10 is a diagram for explanation of a principle of trapping ions by using a baseball magnetic field.

FIG. 10 is a diagram for explanation of a principle of trapping ions by using the baseball magnetic field. As shown in FIG. 10, when current is flowed in the coil 17, the magnetic field in which the magnetic flux density is low at the central part of the coil 17 and the magnetic flux density increases in all directions from the central part toward the peripheral part of the ball shape. In FIG. 10, the intensity of the magnetic field along the X-axis and Y-axis perpendicular through the center of the coil 17 is shown by solid lines.

Since ions having velocities in a direction away from the central part of the coil 17 are returned by the strong magnetic field in the vicinity of the end surface of space substantially in a spherical shell form surrounded by the coil 17, the ions can be trapped at near the central part of the coil 17 (on the periphery of the light emitting point). Further, in the embodiment, by providing an electrode on the rear surface of the collector mirror 5 and applying a positive high potential to the electrode, the damage to the collector mirror 5 can be prevented without making the intensity of magnetic field generated by the coil 17 higher.

Figure 11:
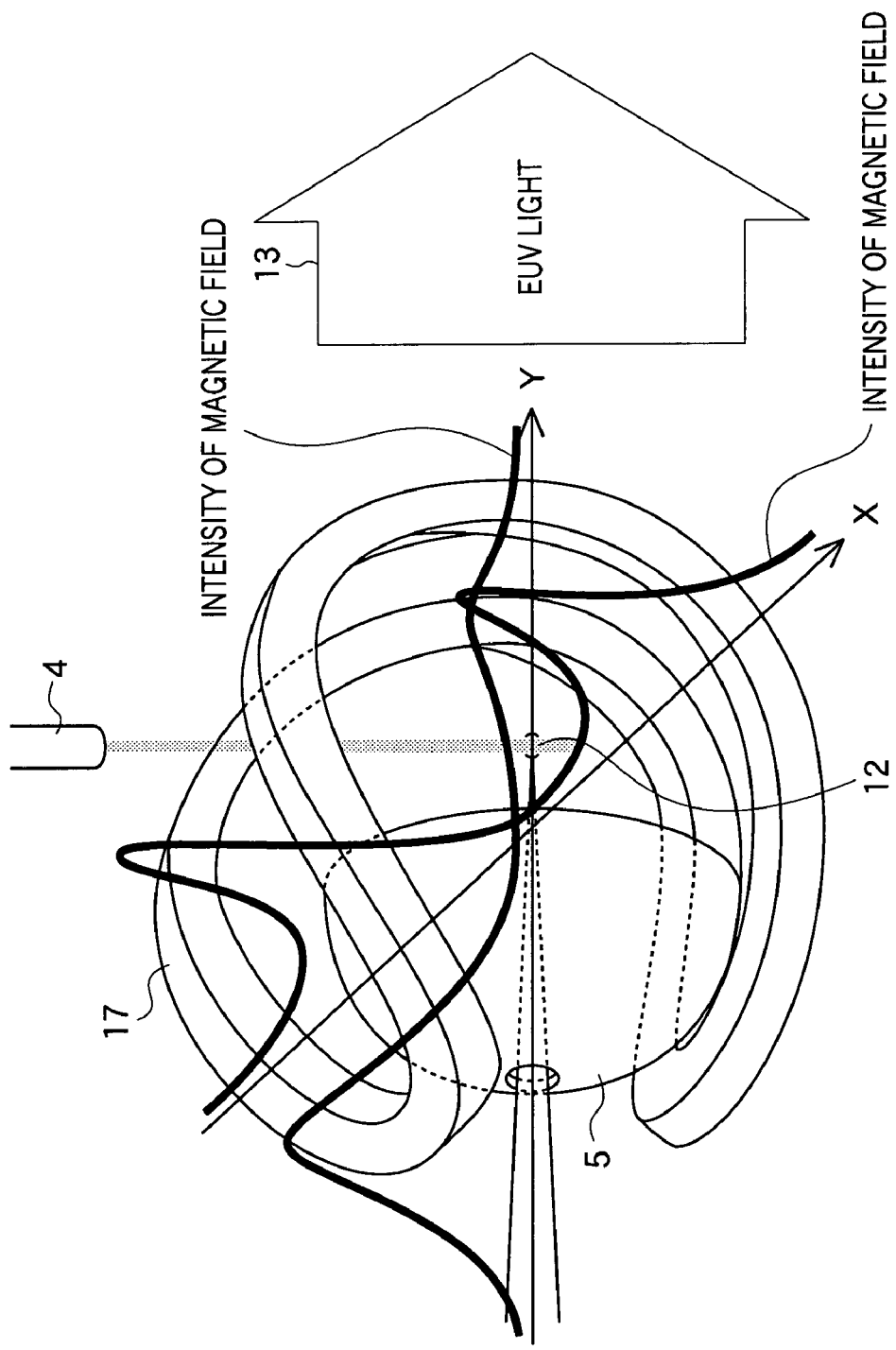
FIG. 11 shows an example in which a magnetic field with a biased intensity distribution is generated by using a baseball-shaped coil.

Further, in the case of using the baseball-shaped coil 17, in order to reduce ions incident to the collector mirror 5 and reduce the concentration of the residual target gas near the plasma, as shown in FIG. 11, a magnetic field may be generated such that the magnetic flux density at the opposite side to the collector mirror 5 becomes low. In this case, the ions flying out from the plasma 12 toward the collector mirror 5 direction are deflected by the magnetic field and discharged in a direction in which the magnetic flux density is lower, that is, in a direction opposite to the collector mirror 5. Thereby, the absorption of the generated EUV light by the target gas can be suppressed.

Next, exposure equipment according to one embodiment of the present invention will be described.

Figure 12:
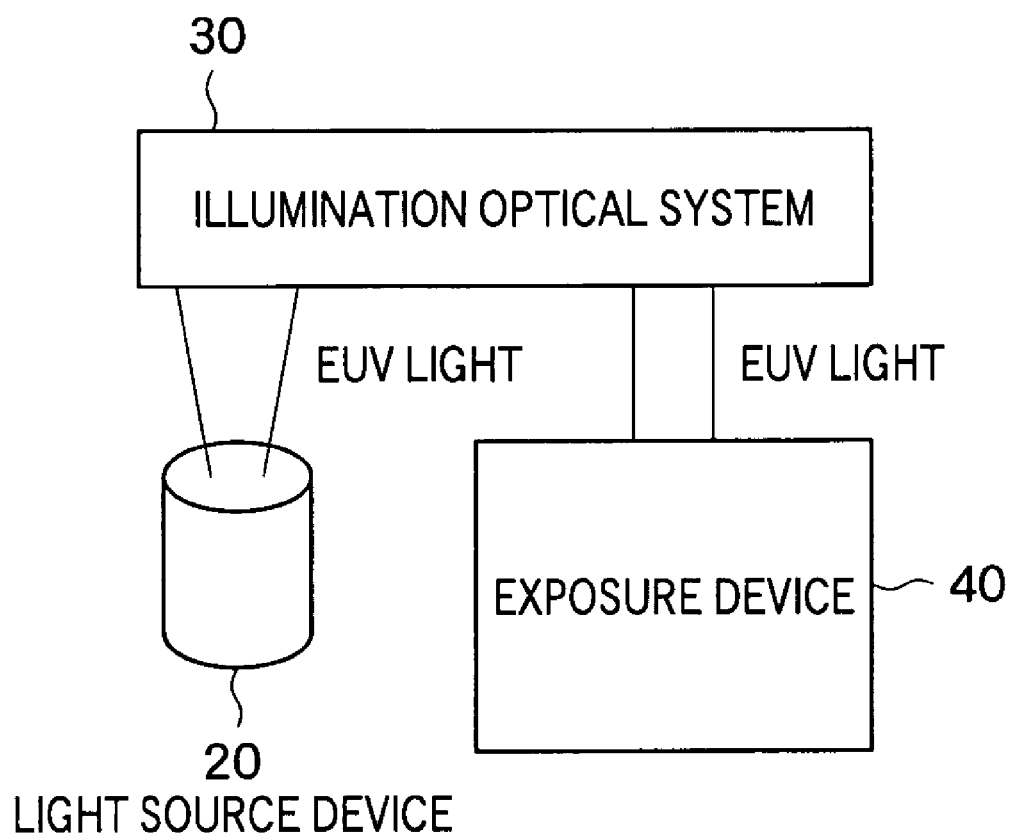
FIG. 12 shows the constitution of exposure equipment according to one embodiment of the present invention.

In FIG. 12, the constitution of the exposure equipment according to the one embodiment of the present invention is shown. This exposure equipment uses the above-described light source device as a light source, and, since debris is trapped in the light source, the adverse effect on the optical system can be reduced.

As shown in FIG. 12, the exposure equipment according to the one embodiment of the present invention includes a light source device 20 for generating EUV light, an illuminating optical system 30 for collecting the EUV light generated by the light source device 20 onto a reticle (mask) by using plural mirrors, and an exposure device 40 for exposing an object to light by employing the EUV light reflected from the mask. The entire exposure equipment is installed within a vacuum system that is maintained at low pressure by a vacuum pump or the like.

Next, the operation of the exposure equipment according to the embodiment will be described.

The illuminating optical system 30 collects the EUV light generated by the light source device 20 onto the mask by plural collector mirrors. The illuminating optical system 30 is constituted entirely by reflective systems, and the total reflectance is about 65%.

A desired pattern is formed on the mask, and the mask reflects the EUV light entered from the illuminating optical system 30 according to the formed pattern. The exposure device 40 projects the EUV light reflected by the mask onto a resist applied to a wafer and exposes the resist to the light. Thereby, the pattern on the mask can be reduced and transferred to the resist on the wafer.

Figure 13A:
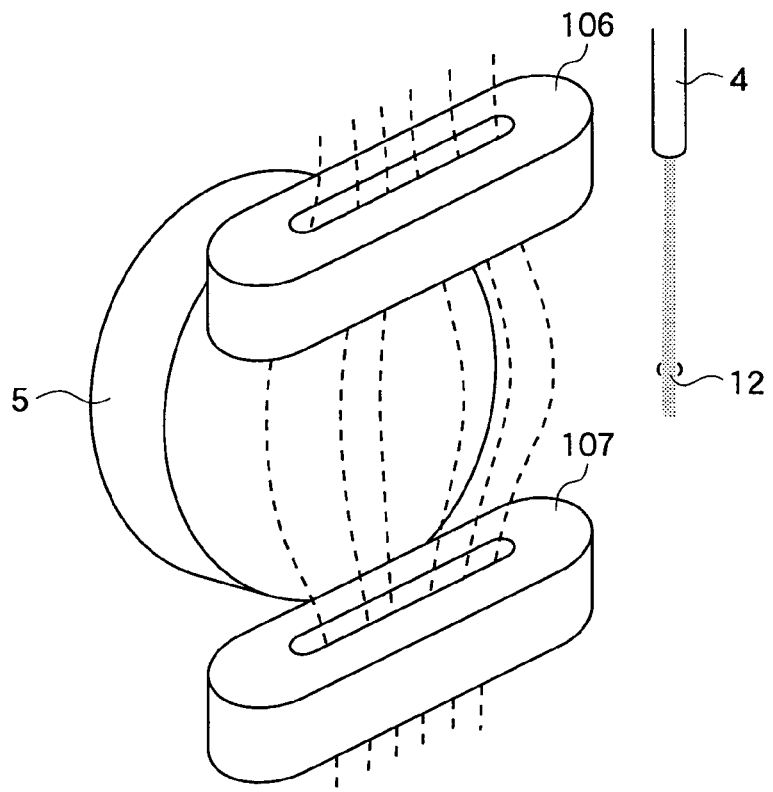
FIGS. 13A and 13B are perspective views showing an arrangement of coils in the case where a magnetic field with a biased intensity distribution is formed by using a race-track-shaped coils.
Figure 13B:
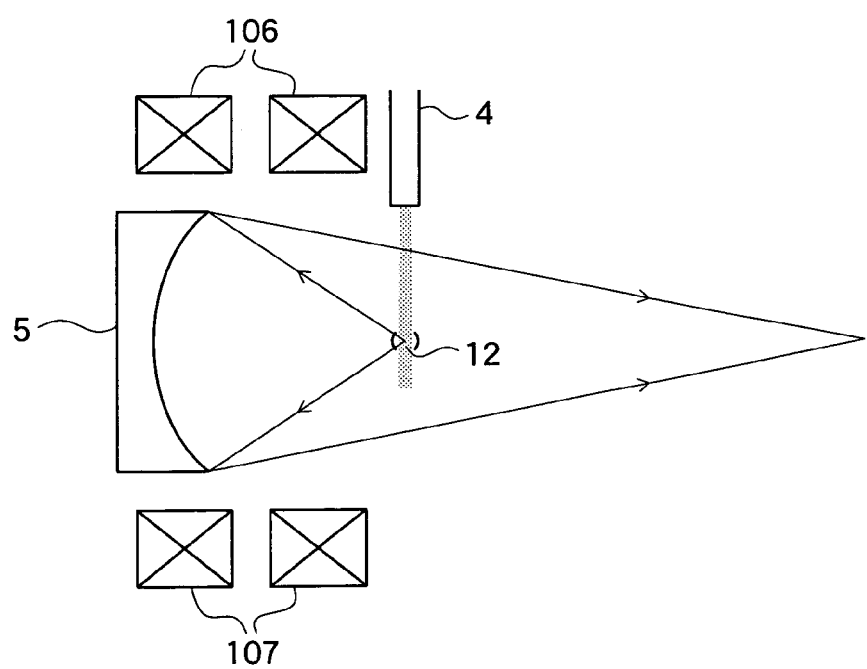
Figure 14:
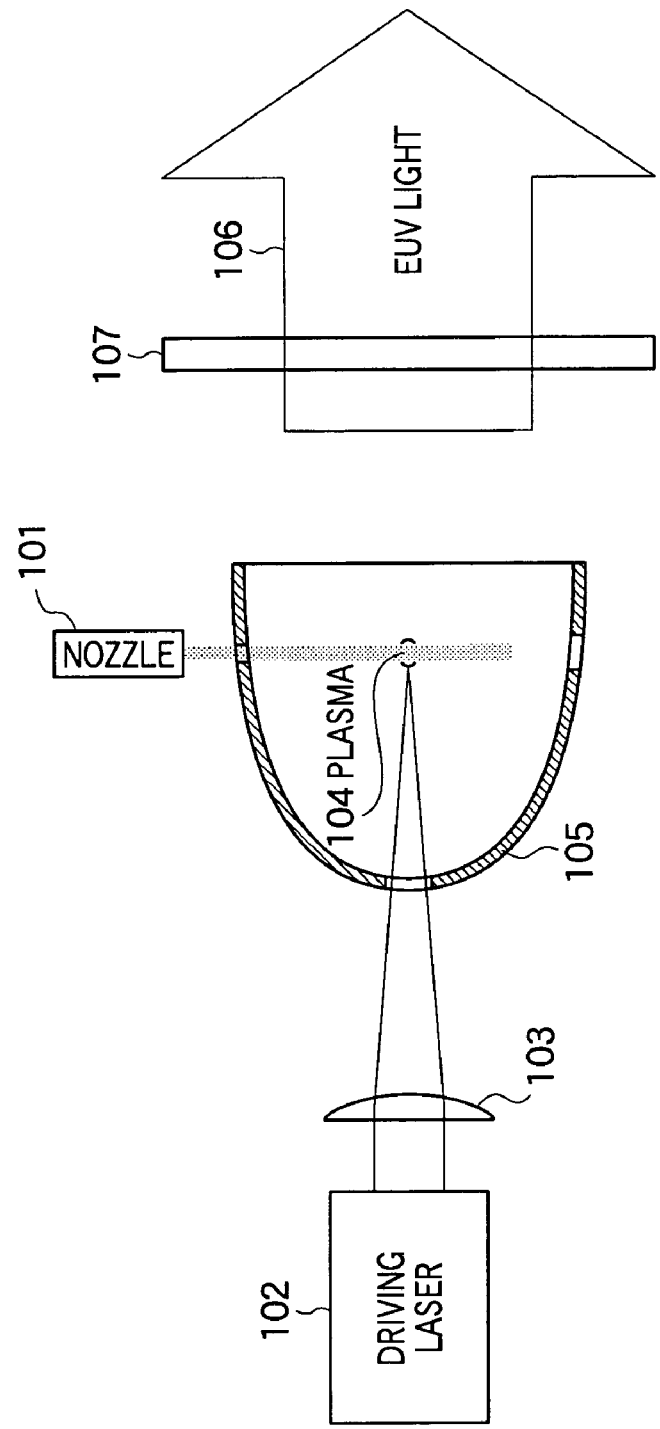
FIG. 14 shows the constitution of a conventional light source device.

In the embodiment of the present invention, the coils 6 and 7 are arranged such that the central axes thereof may pass through the light emitting point. However, as an arrangement in the case where the magnetic flux density at the opposite side to the collector mirror 5 is made low, the coils can be arranged such that the central axes thereof may not pass through the light emitting point. As shown in FIGS. 13A and 13B, coils 106 and 107 are racetrack-shaped coils having elliptical forms, and the central axes of the coils are located between the light emitting point and the collector mirror 5. Thereby, due to the same effect as in the case shown in FIGS. 6A and 6B, the ions flying out from the plasma 12 toward the collector mirror 5 are deflected by the magnetic field and discharged in a direction in which the magnetic flux density is lower, that is, in a direction opposite to the collector mirror 5. As a result, the ions incident to the collector mirror 5 can be reduced and the concentration of the residual target gas near the plasma can be reduced.

Although the description is made for an LPP light source using plasma generated by applying a laser beam to a target as the EUV light source, the present invention can be adapted to a DPP light source using plasma generated by discharge.

What is claimed is:

1. A light source device for generating extreme ultra violet light by applying a laser beam to a target, said device comprising:
    a target supply unit for supplying a material to become said target;
    a laser unit for generating plasma by applying a laser beam to said target;
    a collection optical system for collecting the extreme ultra violet light radiating from said plasma and emitting the extreme ultra violet light; and
    magnetic field generating means for generating a magnetic field within said collection optical system when supplied with current so as to trap charged particles radiating from said plasma.

2. The light source device according to claim 1, wherein said magnetic field generating means includes a pair of mirror coils that sandwich said collection optical system.

3. The light source device according to claim 1, wherein said magnetic field generating means includes a baseball coil that wraps around said collection optical system.

4. The light source device according to claim 1, further comprising:
    current supply means for supplying current to said magnetic field generating means so as to generate a steady magnetic field within said collection optical system.

5. The light source device according to claim 1, further comprising:
    current supply means for supplying current to said magnetic field generating means; and
    timing control means for controlling said current supply means to generate a pulse magnetic field within said collection optical system.

6. The light source device according to claim 1, further comprising:
    an electrode for generating an electric field in a periphery of said collection optical system; and
    voltage supply means for applying a positive potential to said electrode.

7. The light source device according to claim 6, further comprising:
    current supply means for supplying current to said magnetic field generating means; and
    timing control means for controlling said current supply means to generate a pulse magnetic field within said collection optical system and controlling said voltage supply means to generate a pulse electric field in the periphery of said collection optical system.

8. The light source device according to claim 1, further comprising:
    charging means for ionizing and/or charging neutral particles by applying ultraviolet light to the neutral particles radiating from said plasma.

9. Exposure equipment for exposing an object to light by using extreme ultra violet light generated by applying a laser beam to a target, said equipment comprising:
    a target supply unit for supplying a material to become said target;
    a laser unit for generating plasma by applying a laser beam to said target;
    a collection optical system for collecting the extreme ultra violet light radiating from said plasma and emitting the extreme ultra violet light;
    magnetic field generating means for generating a magnetic field within said collection optical system when supplied with current so as to trap charged particles radiating from said plasma;
    an illuminating optical system for collecting the extreme ultra violet light emitted from said collection optical system onto a mask by using plural mirrors; and
    a projection optical system for exposing said object to light by using the extreme ultra violet light reflected from said mask.

10. The exposure equipment according to claim 9, wherein said magnetic field generating means includes a pair of mirror coils that sandwich said collection optical system.

11. The exposure equipment according to claim 9, wherein said magnetic field generating means includes a baseball coil that wraps around said collection optical system.

12. The exposure equipment according to claim 9, further comprising current supply means for supplying current to said magnetic field generating means so as to generate a steady magnetic field within said collection optical system.

13. The exposure equipment according to claim 9, further comprising:
    current supply means for supplying current to said magnetic field generating means; and
    timing control means for controlling said current supply means to generate a pulse magnetic field within said collection optical system.

14. The exposure equipment according to claim 9, further comprising:
    an electrode for generating an electric field in a periphery of said collection optical system; and
    voltage supply means for applying a positive potential to said electrode.

15. The exposure equipment according to claim 14, further comprising:
    current supply means for supplying current to said magnetic field generating means; and
    timing control means for controlling said current supply means to generate a pulse magnetic field within said collection optical system and controlling said voltage supply means to generate a pulse electric field in the periphery of said collection optical system.

16. The exposure equipment according to claim 9, further comprising:
    charging means for ionizing and/or charging neutral particles by applying ultraviolet light to the neutral particles radiating from said plasma.

* * * * *